United States Patent
Hiyoshi et al.

[11] Patent Number: 5,990,501
[45] Date of Patent: Nov. 23, 1999

[54] MULTICHIP PRESS-CONTACT TYPE SEMICONDUCTOR DEVICE

[75] Inventors: Michiaki Hiyoshi; Kazunobu Nishitani, both of Yokohama, Japan

[73] Assignee: Kabushiki Kaisha Toshiba, Kawasaki, Japan

[21] Appl. No.: 08/866,158

[22] Filed: May 30, 1997

[30] Foreign Application Priority Data

May 31, 1996 [JP] Japan ................................ 8-138818

[51] Int. Cl.⁶ .......................... H01L 29/74; H01L 31/111
[52] U.S. Cl. ........................ 257/181; 257/688; 257/785
[58] Field of Search .................................. 257/181, 785, 257/688, 723, 133

[56] References Cited

U.S. PATENT DOCUMENTS

| | | | |
|---|---|---|---|
| 4,609,937 | 9/1986 | Takeuchi et al. | 257/785 |
| 4,775,916 | 10/1988 | Kouzuchi et al. | 257/785 |
| 4,918,514 | 4/1990 | Matsuda et al. | 257/182 |
| 5,360,985 | 11/1994 | Hiyoshi et al. | 257/181 |
| 5,610,439 | 3/1997 | Hiyoshi et al. | 257/688 |
| 5,726,466 | 3/1998 | Nishitani | 257/181 |
| 5,760,425 | 6/1998 | Kobayashi | 257/181 |

*Primary Examiner*—Olik Chaudhuri
*Assistant Examiner*—Phat X. Cao
*Attorney, Agent, or Firm*—Oblon, Spivak, McCLelland, Maier & Neustadt, P.C.

[57] ABSTRACT

A multichip press-contact type semiconductor device including a plurality of semiconductor chips, a plurality of heat buffer plates, a conductive metal sheet, and first and second press-contact electrode plates. The heat buffer plates are disposed to correspond to the plurality of semiconductor chips. The conductive metal sheet is located on the plurality of heat buffer plates and substantially decreases the parasitic inductance by causing a short-circuit in electrode wiring connecting the semiconductor chips. The first press-contact electrode plate is located on the conductive metal sheet, and has column protrusions corresponding to the semiconductor chips on the surface facing the semiconductor chips. The second press-contact electrode plate is located on the side of the rear surface of the semiconductor chips. The first and second press-contact electrode plates hold therebetween the conductive metal sheet, the heat buffer plates, and the semiconductor chips, piled on each other.

18 Claims, 6 Drawing Sheets

MULTICHIP PRESS-CONTACT TYPE SEMICONDUCTOR DEVICE

BACKGROUND OF THE INVENTION

This invention relates to a multichip presscontact type semiconductor device used in a state where a plurality of semiconductor chips press-contacted each other, in particular, a device suitable as a multichip press-contact type IGBT (Insulated Gate Bipolar Transistor) for controlling the motor drive of an electric train or traction inverter application for which high withstand voltage and high reliability are required.

The conventional multichip press-contact type IGBT has a construction such as shown in FIG. 1. FIG. 1 is a sectional view of the enlarged main portion of the device taken out from a package. Such a press-contact type semiconductor device is described, for example, in U.S. patent Ser. Nos. 08/656,868, 08/665,980, and 08/526,320, which are disclosed by the inventors of the present invention, and so on.

A FRD (First Recovery Diode) chip 12 is connected in parallel to a IGBT (Insulated Gate Bipolar Transistor) chip 11 having the current flowing direction opposite to that of the FRD chip 12. The plain where the chip 11 and chip 12 are disposed is provided thereon with a plurality of the chips 11 and 12 although FIG. 1 does not show this. A chip frame 13 fixes and positions the IGBT chip 11 and the FRD chip 12 and fixes them. Heat buffer plates 14 each made from materials such as Mo (molybdenum) are located on the main surfaces of the chips 11 and 12 so as to radiate heat from the main surfaces of the chips. Similarly, a heat buffer disk plate 15 made from materials such as Mo is provided on the rear surfaces of the chips 11 and 12 so as to radiate the heat from the rear surfaces of the chips. A resin frame 16 having an opening facing the IGBT chip 11 and the FRD chip 12 and the heat buffer disk plate 15 hold the chips 11 and 12 therebetween such that the chips 11 and 12 are positioned and fixed in a vertical direction. A ring frame 17 has an opening at a position corresponding to a collector press-contact electrode plate 28. The opening of the ring frame 17 is engaged with the resin frame 16, thereby the chips 11 and 12 and the heat buffer disk plate 15 are held by the ring frame 17 and the resin frame 16. On the rear surface of an emitter press-contact electrode plate 27 which faces the chips 11 and 12, a separation trench for making the pressure applied to each of the chips even is formed at a non-press-contact portion where the emitter press-contact electrode plate 27 are not connected to the chips. In the trench, the column protrusions corresponding to the chips 11 and 12 are formed. The emitter press-contact electrode plate 27 and the collector press-contact electrode plate 28 are applied with a pressure as highas 10 MPa to use the chips 11 and 12, heat buffer plate 14, and heat buffer disk plate 15 in the press-contact state. A contact probe 30 contained in a sheath-like insulator 31 is arranged to contact the gate electrode of the IGBT chip 11. The contact probe 30 is connected to the gate wiring to which a control signal is supplied.

FIG. 2 presents an equivalent circuit diagram of the multichip press-contact IGBT described above. The IGBT chip 11 having a MOS gate structure has capacitance Cge between the gate and the emitter, capacitance Ccg between the collector and the gate, and capacitance Cce between the collector and the emitter. When the plurality of IGBT chips 11 are connected in parallel, a parasitic inductance Le is generated in the emitter wiring connecting the chips 11, and a parasitic inductance Lc is generated in the collector wiring connecting the chips 11. Similarly, when a plurality of FRD chips 12 are connected in parallel, a parasitic inductance La is generated in the anode wiring connecting the chips 12, and a parasitic inductance Lk is generated in the cathode wiring connecting the chips 12.

As is clear from the above-mentioned constitution, when a plurality of IGBT chips and a plurality of FRD chips are connected in parallel, the LCR oscillation circuit is constituted by the capacitances, parasitic inductances, and parasitic resistances in the circuit. The LCR oscillation circuit needs to be prevented from oscillating in operating the device.

In general, with the constitution shown in FIG. 2, the LCR circuit can easily oscillate unless the parasitic inductance Lc in the collector wiring is not set larger than the parasitic inductance Le. However, in the multichip press-contact type IGBT constituted as shown in FIG. 1, the parasitic inductance Le is necessarily set larger than the parasitic inductance Lc in the collector wiring due to the structural limitation. The emitter wiring (the current path in the emitter press-contact electrode plate 27) connecting the chips is lengthened due to the separation trench which is formed on the rear surface of the emitter press-contact electrode plate facing the chips in order to make the pressure applied to each of the chips even. When the LCR circuit constituted by the parasitic inductances, capacitances, and parasitic resistances is triggered to oscillate by noise and the like, errors may occur in the operation of the IGBT chips 11, and the IGBT may be damaged.

In order to form the above-mentioned multichip press-contact type IGBT chips with a high withstand voltage, the collector and the emitter need to be separated by a predetermined creepage distance. Generally, the creepage distance is determined as 1 mm/1 kV. Therefore, for the withstand voltage of 1 kV, the creepage distance as long as 1 mm is needed. In the device with the withstand voltage as high as 2500V, the creepage distance of at least 2.5 mm needs to be provided between the collector and the emitter. When the collector and the emitter in the structure shown in FIG. 1 are formed with a sufficiently long creepage distance therebetween, the heat buffer plate 14 needs to be formed thick, and thus the thermal resistance increases in the buffer plate. The increase of the thickness of the heat buffer plates 14 lengthens the emitter wiring, and thus the parasitic inductance Le in the emitter wiring increases as the withstand voltage of the device increases. Therefore, in the conventional device, if the heat buffer plate is formed thick to obtain the sufficient creepage distance, the parasitically constituted LCR oscillation circuit may be easily oscillated.

BRIEF SUMMARY OF THE INVENTION

The object of the present invention is to provide a multichip press-contact type semiconductor device capable of preventing the oscillation of the parasitically constituted LCR circuit.

The other object of the present invention is to provide a multichip press-contact type semiconductor device in which the creepage distance in the semiconductor chip can be easily obtained and high withstand voltage is easily attained.

The above-mentioned objects of the present invention are attained by the multichip press-contact type semiconductor device comprising a plurality of semiconductor chips located on a plain; a plurality of heat buffer plates each provided on the main surface of each of the plurality of semiconductor chips; a conductive metal sheet disposed on the heat buffer plates, for decreasing the parasitic inductances in an electrode wiring connecting the semiconductor chips; a first press-contact electrode plate disposed on the conductive metal sheet, the first press-contact electrode plate having column protrusions corresponding to the semiconductor chips on the side facing the semiconductor chips; and a second press-contact electrode plate disposed on the rear surfaces of the semiconductor chips, wherein the conductive metal sheet, and the plurality of heat buffer plates, the plurality of semiconductor chips are piled up and brought into press-contact with each other by the first and second press-contact electrode plates.

The above-mentioned objects of the present invention are also attained by the multichip press-contact type semiconductor device comprising a plurality of semiconductor chips located on a plain; a conductive metal sheet for decreasing the parasitic inductances in an electrode wiring connecting the semiconductor chips, the conductive metal sheet being disposed on the main surfaces of the semiconductor chips; a plurality of heat buffer plates each provided on the conductive metal sheet to correspond to each of the semiconductor chips; a first press-contact electrode plate each disposed on the conductive metal sheet, the first press-contact electrode plate having column protrusions corresponding to the semiconductor chips on the side facing the semiconductor chips; and a second press-contact electrode plate disposed on the rear surfaces of the semiconductor chips, wherein the plurality of heat buffer plates, the conductive metal sheet, and the plurality of semiconductor chips are piled up and brought into press-contact with each other by the first and second press-contact electrode plates.

According to the above constitution, the parasitic inductances in the electrode wiring connecting the semiconductor chips can be decreased by the conductive metal sheet, and thus the LCR circuit parasitically constituted in the circuit can be prevented from oscillating.

Further, with the above structures, by interposing an insulating sheet into a non-press-contact portion between the heat buffer plate and the conductive metal sheet, which is not pressed by the first and second press-contact electrode plates, the creepage distance necessary for insulating the emitter electrode from the collector electrode can be obtained in the device without increasing the thickness of the heat buffer plate or the emitter wiring length, thereby high withstand voltage can be easily attained.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
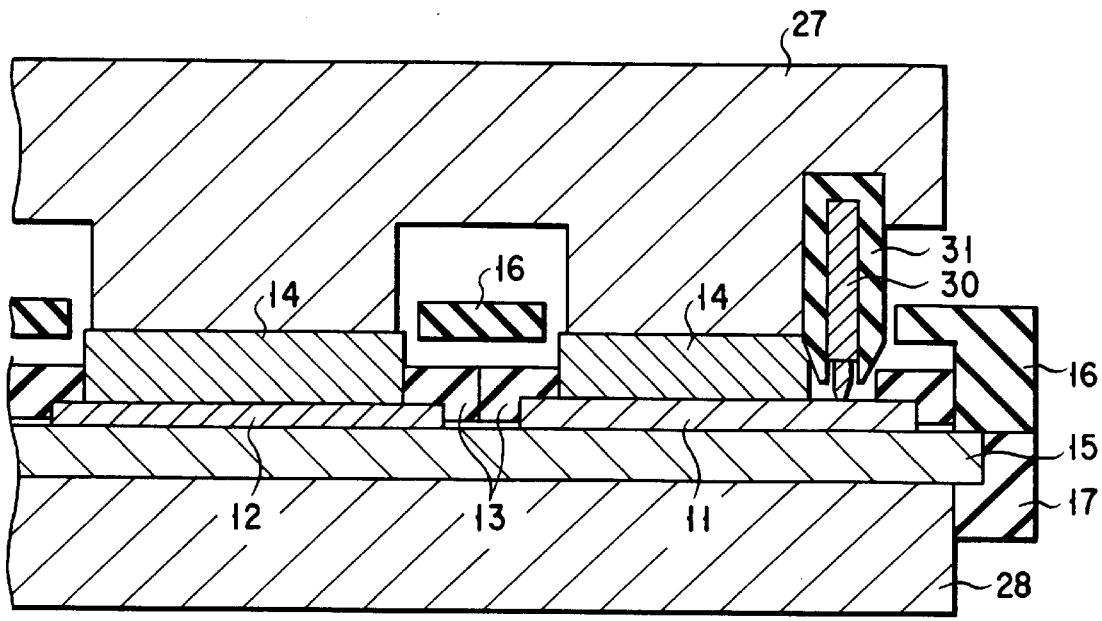
FIG. 1 is a sectional view of the enlarged main portion of the conventional multichip press-contact type semiconductor device taken out from a package.
Figure 2:
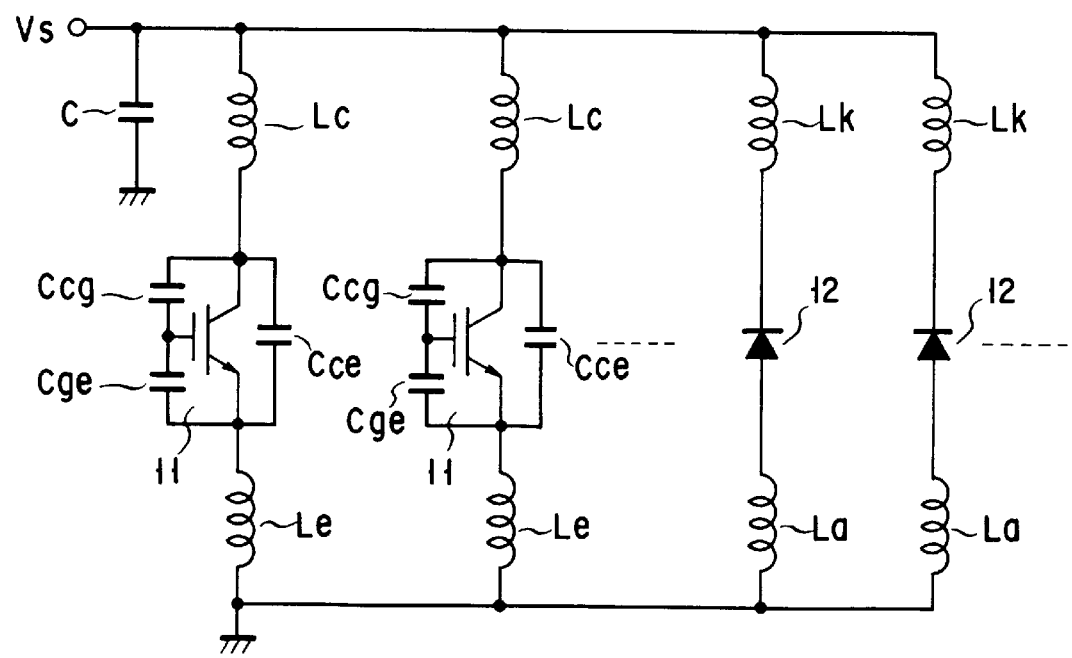
FIG. 2 is an equivalent circuit diagram of the conventional multichip press-contact type semiconductor device wherein a plurality of IGBT chips and a plurality of FRD chips are brought into press-contact.
Figure 3:
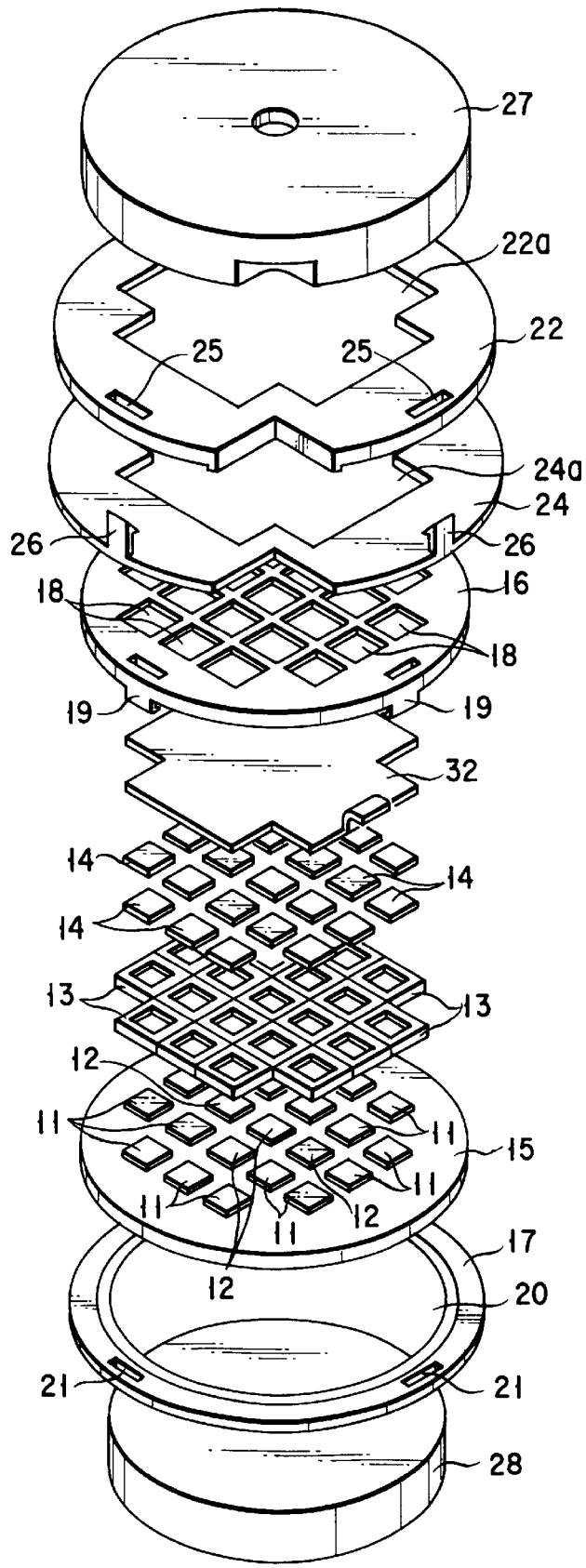
FIG. 3 is a plain view showing the arrangement of the multichip press-contact type semiconductor device according to the first embodiment of the present invention, taken out from a package.
Figure 4:
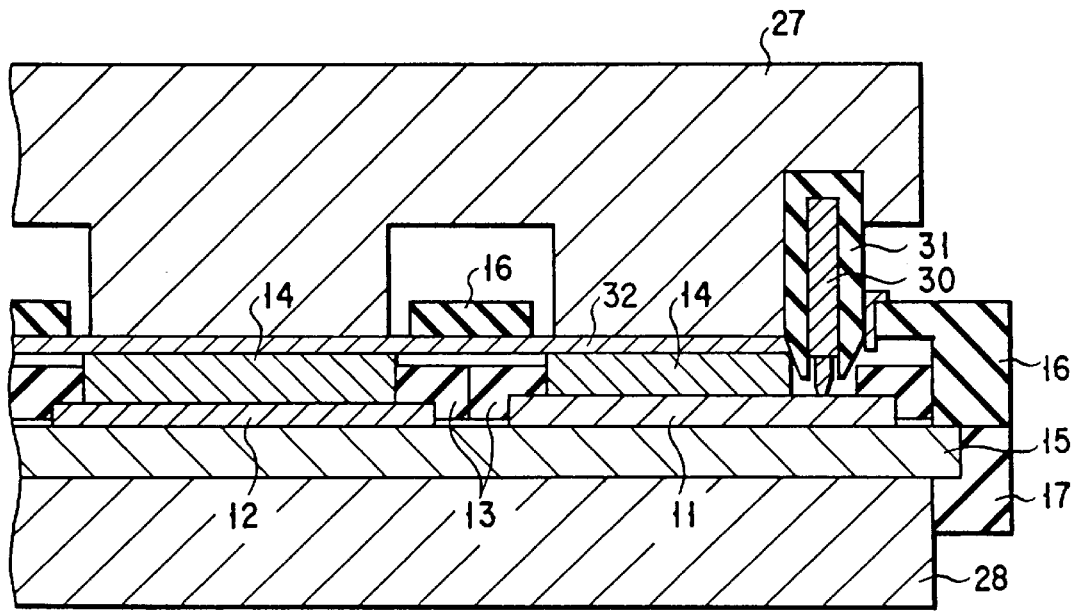
FIG. 4 is an enlarged sectional view of the main portion of the multichip press-contact type semiconductor device shown in FIG. 3.
Figure 5:
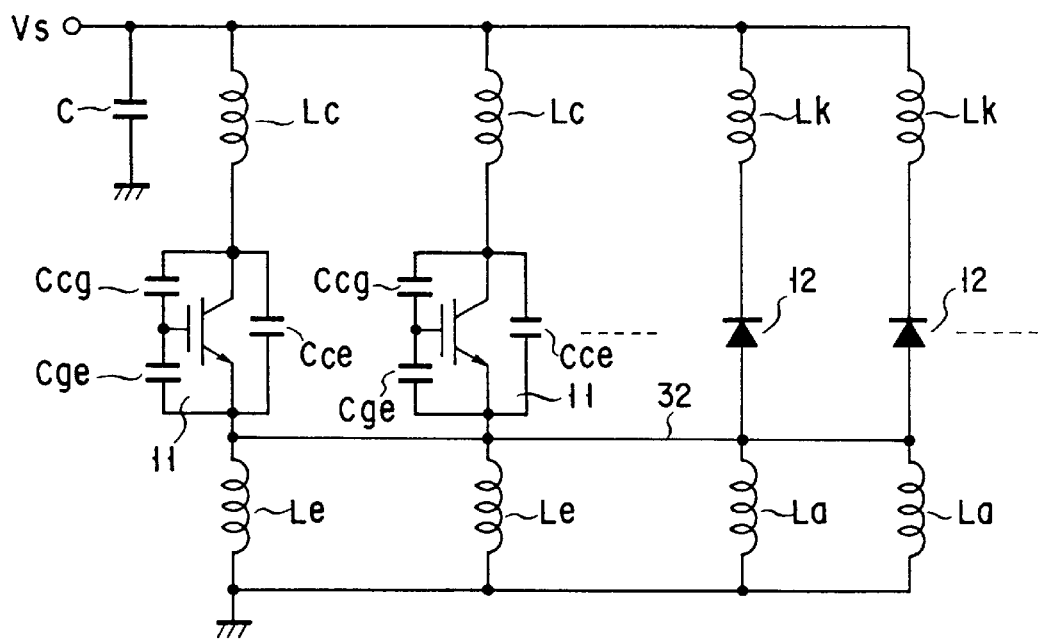
FIG. 5 is an equivalent circuit diagram of the multichip press-contact type semiconductor device shown in FIGS. 3 and 4.

FIG. 3 is a plain view showing the arrangement of the multichip press-contact type semiconductor device according to the first embodiment of the present invention, which is taken out from a package. FIG. 4 is an enlarged sectional view of the main portion of the multichip press-contact type semiconductor device shown in FIG. 3. FIG. 5 is an equivalent circuit diagram of the multichip press-contact type semiconductor device shown in FIGS. 3 and 4.

In the first embodiment, each of a plurality of IGBT chips 11 and a plurality of FRD chips 12 which has the current flowing direction opposite to that of the IGBT chips, and connected in parallel to each of the IGBT chips are brought into press-contact by a pair of press-contact electrode plates comprised of emitter press-contact electrode 27 and collector press-contact electrode 28. The multichip press-contact type semiconductor device is attained in this manner.

Each of the chip frames 13 supports the four sides of the corresponding one of the IGBT chips 11 or the FRD chips 12, thereby the horizontal displacements of the chips are prevented. The chip frames 13 are made from materials such as silicone resin and polyetherimide, and fixed around on each of the chips 11 and 12 by means of an adhesive and the like. The heat buffer plates 14 (the heat buffer plates on the side of the emitter) are each formed of, for example, a molybdenum plate with a thickness of 1–2 mm, and disposed on the main surfaces of the IGBT chips 11 and the FRD chips 12 through windows of the chip frames 13. The heat buffer plates 14 each have a radius of curvature of 0.2–1 mm at the corners in order to prevent the concentration of the weight pressure on the corners of the chips. Further, to compensate the difference between the IGBT chips 11 and the FRD chips 12 in thickness, the IGBT chips and FRD chips and the heat buffer plates respectively formed on the corresponding chips, are formed such that the sum of the thicknesses of the IGBT chip 11 and the heat buffer plate 14 substantially equal to the sum of the thicknesses of the FRD chip 12 and the heat buffer plate 14.

The conductive metal sheet 32 is disposed on the heat buffer plates 14. The conductive metal sheet 32 is formed of, for example, a pressed hard Cu sheet having the thickness around 100 μm and coated with nickel (Ni) plating for preventing oxidization. A molybdenum sheet with thickness around 100 μm, which is subjected to a process such as removal of a thermal oxidized film and punched, may be also used to form the conductive metal sheet 32. Molybdenum has the thermal expansion coefficient approximate to that of the silicon, and thus the stress applied to the IGBT chips 11 and the FRD chips 12 when the device is subjected to the heat cycle due to the difference in the thermal expansion coefficient between the conductive metal sheet 32 and the chips 11, chips 12, can be alleviated by using the Mo sheet.

The conductive metal sheet 32 is provided with a resin frame thereon. In the central portion of the resin frame 16, openings 18 are formed at the positions corresponding to the positions of the chips 11 and 12, to form a lattice frame in the resin frame. On the peripheral portion of the resin frame 16, claws 19 are formed. In the ring frame 17, an opening 20 is formed at the position corresponding to that of the heat buffer disk plate 15 (the heat buffer plate on the side of the collector) disposed on the rear side of the chips 11 and 12, and engaging holes 21 of the ring frame 17 are formed at positions corresponding to the claws 19. Each of the claws 19 of the resin frame 16 engages with the corresponding one of the engaging holes 21. By engaging the resin frame 16 and the ring frame 17 in this manner, the conductive metal sheet 32, the heat buffer plates 14, the chip frames 13, the IGBT chips 11, the FRD chips 12, and the heat buffer disk plate 15 are held therebetween.

Further, an opening 22a is formed in a frame-like resin board 22 at a position corresponding to the portion where chips 11 and 12 are arranged. The rear surface of the frame-like resin board 22 is provided at the positions corresponding to the gate electrodes of the chips 11 with a gate wiring for supplying a control signal to each of the gate electrodes of the IGBT chips through each of the contact probes 30, in order to control contact probes 30 and each of the IGBT chips 11. Each of the contact probes 30 is press-contacted to the gate electrode of corresponding one of the IGBT chips by a spring (not shown). The gate wiring is fixed to the frame-like resin board 22, and protected by a resin protection cover 24 shaped to correspond to the opening 22a. The peripheral portion of the frame-like resin board 22 is provided with engaging holes 25, and the protection cover 24 is provided with claws 26 at the positions corresponding to the engaging holes such that the engaging holes 25 each engages with corresponding one of the claws 26. By engaging the frame-like resin board 22 and the protection cover 24 in this manner, the gate wiring is protected.

An emitter press-contact plate 27 and a collector press-contact 28 are disposed to hold the IGBT chips 11, FRD chips 12, chip frames 13, heat buffer plates 14, conductive metal sheet 32, heat buffer disk plate 15, insulating frame 16, ring frame 17, protection cover 24, and insulating board 22 therebetween. On the rear surface of the emitter press-contact plate 27, a separation trench is formed at a non-press-contacted position in order to make even the pressure applied on the IGBT chips 11 and the FRD chips 12. The rear surface of the emitter press-contact plate 27 is also provided with column protrusions formed at the positions corresponding to the IGBT chips 11 and the FRD chips 12. The column protrusions press the main surfaces of the IGBT chips 11 and the FRD chips 12 through the opening 22a of the insulating board 22, the opening 24i a of the protection cover 24, the openings 18 of the resin frame 16, conductive metal sheet 32, the heat buffer plates 14, and the openings of the chip frames 13. The multichip press-contact type IGBT having the above-mentioned structure is contained in the package made from a material such as ceramic, and used in a state in which the emitter press-contact electrode plate 27 and the collector press-contact electrode plate 28 are press-contacted with a pressure as high as 10 Mpa.

According to the above-mentioned structure, the conductive metal sheet 32 makes a short-circuit occur between each of the emitters of the IGBT chips and corresponding one of the anodes of the FRD chips in the region in which neither parasitic inductance Le in an emitter wiring nor parasitic inductance La in an anode wiring is present, as illustrated in the equivalent circuit of FIG. 5. The short-circuits bring substantially the same effect as the reduction of the parasitic inductance Le in the emitter wiring connecting the IGBT chips 11. Accordingly, with this structure, the oscillation of the parasitic LCR oscillation circuit, which may be triggered by such a signal as noise which may be generated by switching the IGBT chips, can be prevented, and thus the IGBT chips 11 can be prevented from causing the error, defection, or being damaged.

According to the first embodiment, the conductive metal sheet 32 and the heat buffer plates 14 may be formed integrally when the conductive metal sheet 32 is made of a Mo sheet.

Figure 6:
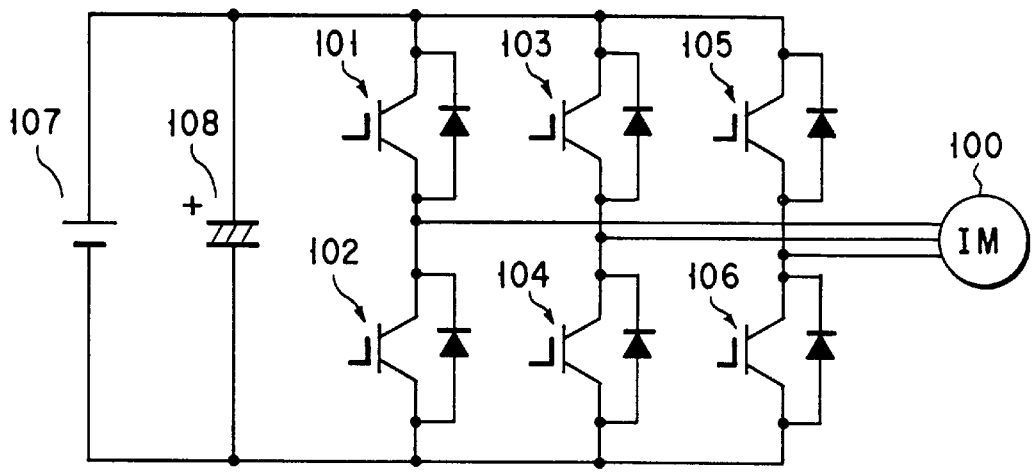
FIG. 6 is a circuit diagram of a 3-phase voltage source inverter as an application of the multichip press-contact type semiconductor device shown in FIGS. 3–5.

FIG. 6 is a circuit diagram of a 3-phase voltage source inverter as an application of the multichip press-contact type semiconductor device shown in FIGS. 3–5. The rotation of an induction motor 100 is controlled by selectively switching the six multichip press-contact type semiconductor devices 101–106. The power source 107 supplies a source voltage to the induction motor 100 in accordance with this selective switching. A capacitor 108 is provided for smoothing and stabilizing the voltage supplied by the power source 107.

The multichip press-contact type IGBT chips 101–106 in the 3-phase voltage source inverter having the above-mentioned constitution have high withstand voltage and can attain high reliability in operation, and thus are suitable for controlling the driving of the motor of the electric train or traction inverter application.

Figure 7:
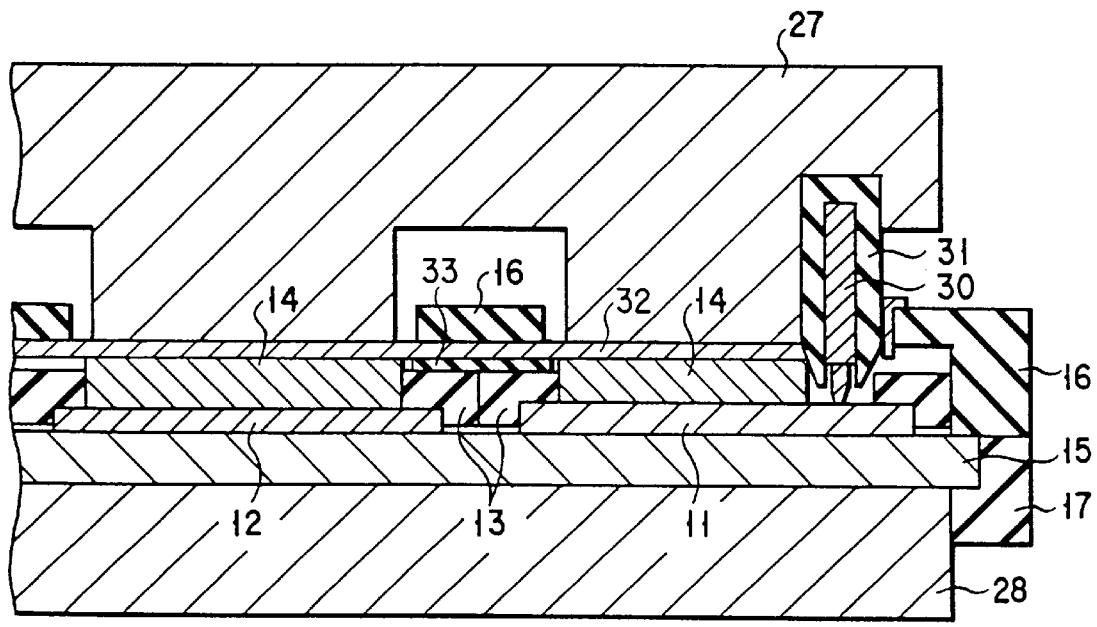
FIG. 7 is an enlarged sectional view of the main portion of the multichip press-contact type semiconductor device according to the second embodiment of the present invention.
Figure 8:
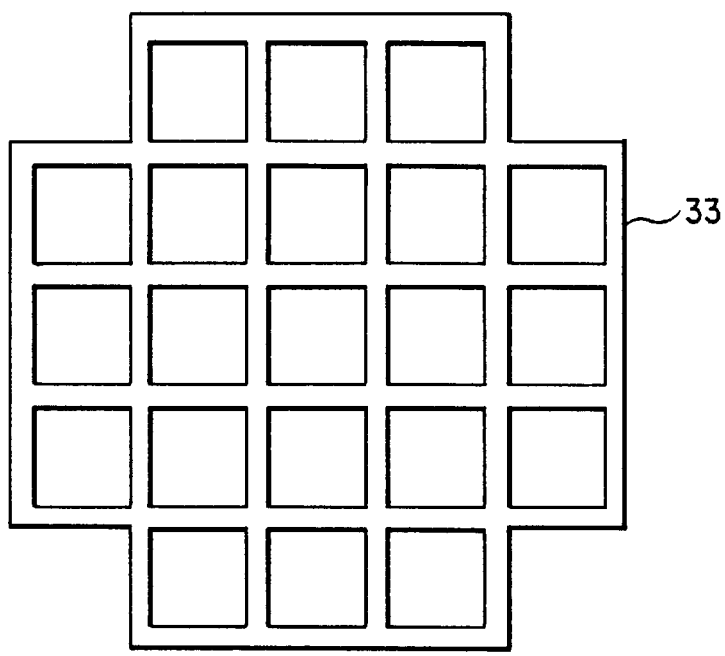
FIG. 8 is a plain view of an insulating sheet in the multichip press-contact type semiconductor device shown in FIG. 7.

FIG. 7 is an enlarged sectional view of the main portion of the multichip press-contact type semiconductor device according to the second embodiment of the present invention, and corresponds to the sectional view of FIG. 4. The multichip press-contact type semiconductor device according to the second embodiment is formed by inserting an insulating sheet 33 into a non-press-contact portion which is not press-contacted between the heat buffer plates 14 and the conductive metal sheet 32 in the device shown in FIGS. 3 and 4. In short, the insulating sheet 33 is disposed between the collector and emitter electrodes of the IGBT chip. The insulating sheet 33 is made of a polyimide film patterned as shown in FIG. 8 and has a 100–200 μm thickness.

With this structure wherein the insulating sheet 33 is disposed between the collector and emitter electrodes of the IGBT chip, the same effect as a long creepage distance in the device can be attained without forming the heat buffer plates 14 thick or elongating the emitter wiring. By virtue of this structure, the creepage distance necessary for the insulation between the emitter electrode and the collector electrode can be substantially attained, and the device attains the high withstand voltage thereby.

Figure 9:
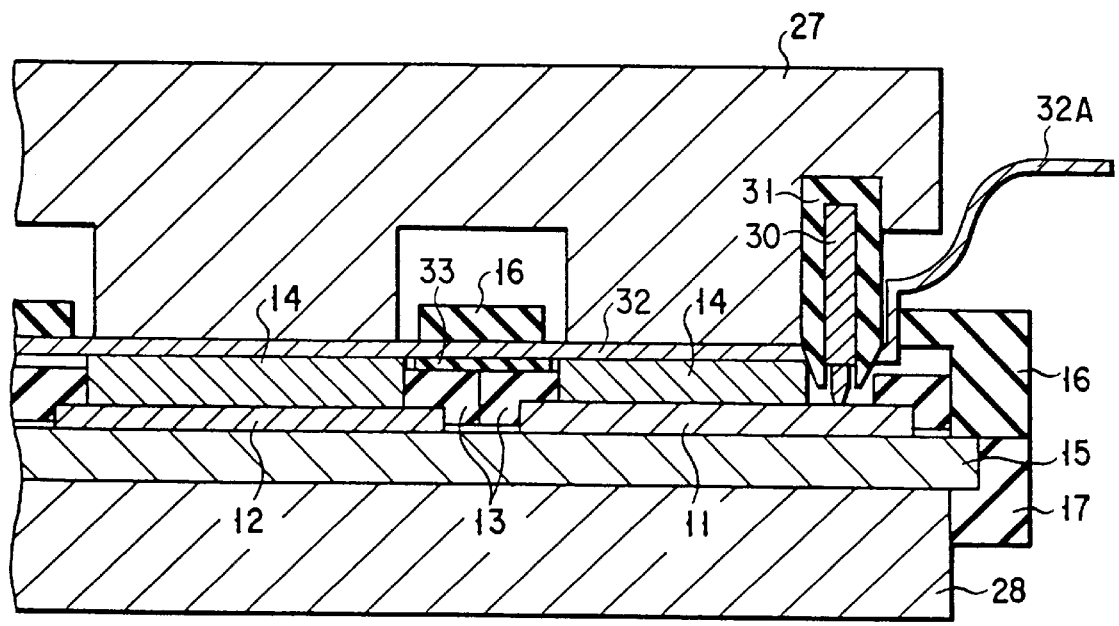
FIG. 9 is an enlarged sectional view of the main portion of the multichip press-contact type semiconductor device according to the third embodiment of the present invention.

FIG. 9 is an enlarged sectional view of the main portion of the multichip press-contact type semiconductor device according to the third embodiment of the present invention, and corresponds to FIGS. 4 and 7. The multichip press-contact type semiconductor device according to the third embodiment is formed to extend the conductive metal sheet 32 of the device shown in FIG. 7 by leading the peripheral portion 32A to the outside of the element (the package) to be used as an emitter control electrode. In the conventional device, the emitter control electrode is outwardly supplied to the device and brazing to the peripheral portion of the emitter press-contact electrode and the like, and thus the inductive component in the emitter press-contact electrode is present in the current path of a control signal. Due to the inductive component, the inductive voltage is added to the voltage of the control signal, and thus the margin of the gate driving voltage sometimes decreases. With the structure shown in FIG. 9, no inductive component of the emitter press-contact electrode plate 27 is present in the current path, the number of errors due to the noise and the like can be decreased and the reliability in the operation can be enhanced.

Figure 10:
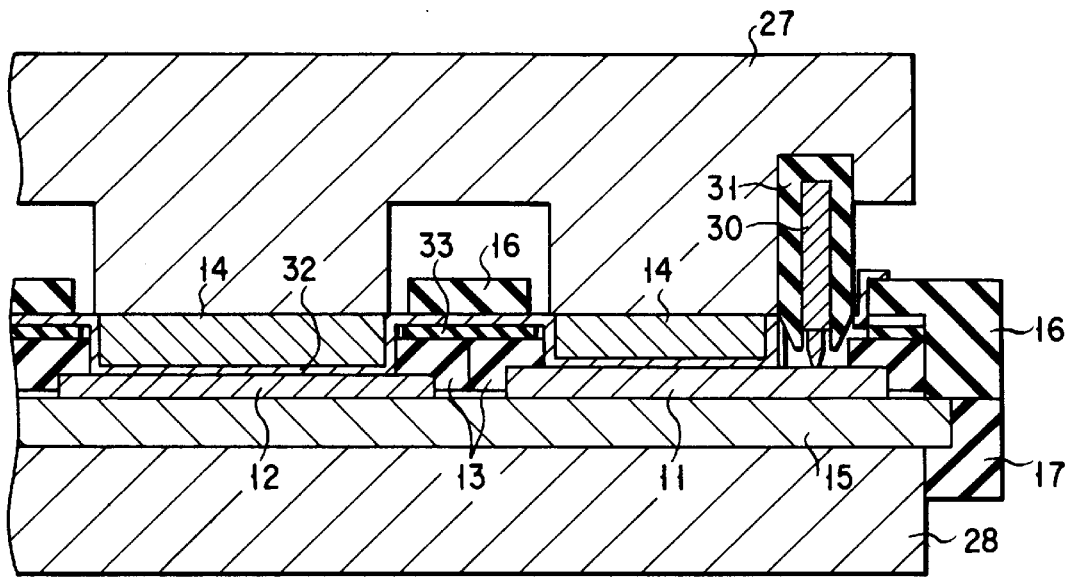
FIG. 10 is an enlarged sectional view of the main portion of the multichip press-contact type semiconductor device according to the fourth embodiment of the present invention.

FIG. 10 is an enlarged sectional view of the main portion of the multichip press-contact type semiconductor device according to the fourth embodiment of the present invention, and corresponds to FIGS. 4, 7, and 9. In the first to third embodiments mentioned above, the conductive metal sheet 32 is disposed between the heat buffer plates 14 and the emitter press-contact plate 27. While, in the fourth embodiment, the conductive metal sheet 32 is disposed between the main surfaces of the IGBT chips 11 and FRD chips 12 and the heat buffer plates 14.

According to this structure, the same effect and advantages as mentioned in the second embodiment can be attained.

The present invention is not limited to the first to fourth embodiments described above, and various changes and modifications may be effected therein by one skilled in the art without departing from the scope or spirit of the invention. More specifically, the present invention relates to a reverse conducting IGBT elements as one example of the various press-contact type semiconductor device in the above-mentioned embodiments, but can be similarly applied to the press-contact type semiconductor device using the other element, of course.

Figure 11:
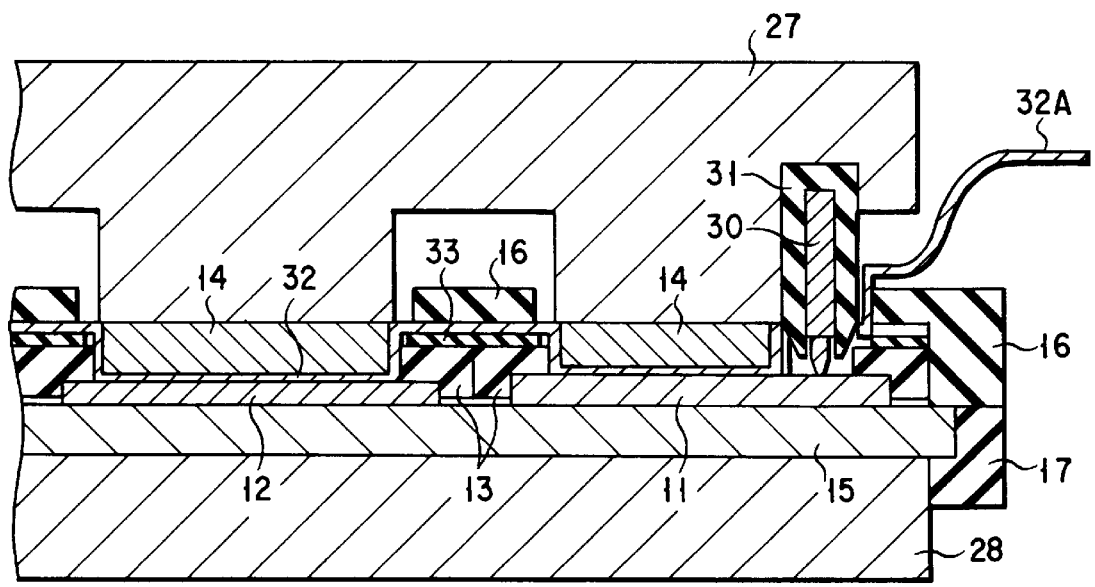
FIG. 11 is an enlarged sectional view of the main portion of the multichip press-contact type semiconductor device according to the fifth embodiment of the present invention.

In the case where the elements having a low withstand voltage is used in the third and fourth embodiments shown in FIGS. 9 and 10, the insulating sheet 33 need not to be provided. Further, the peripheral portion 32A of the conductive metal sheet 32 in the fourth embodiment can be led out to the outside, similarly to the third embodiment shown in FIG. 11.

As described above, according to the present invention, the multichip press-contact type semiconductor device capable of preventing the oscillation of the parasitically formed LCR oscillation circuit can be obtained. The present invention can further obtain the semiconductor device in which the creepage distance in the semiconductor chip can be easily secured and of which a high withstand voltage can be easily attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A multichip press-contact type semiconductor device comprising:
   a plurality of semiconductor chips located on a plane;
   a plurality of heat buffer plates each provided to correspond to each main surface of the plurality of semiconductor chips;
   a conductive metal sheet, disposed on each of the heat buffer plates, for decreasing parasitic inductances in an electrode wiring connecting the semiconductor chips;
   a first press-contact electrode plate disposed on the conductive metal sheet, the first press-contact electrode plate having column protrusions corresponding to the semiconductor chips on a side facing the semiconductor chips;
   a second press-contact electrode plate disposed on rear surfaces of the semiconductor chips; and
   an insulating member disposed in non-pressed portions of the semiconductor chips and between the conductive metal sheet and chip frames in order to secure a creepage distance between electrodes in each of the semiconductor chips,
   wherein the conductive metal sheet, the plurality of heat buffer plates, and the plurality of semiconductor chips are stacked and brought into press-contact with each other by the first and second press-contact electrode plates.

2. A multichip press-contact type semiconductor device according to claim 1, wherein a peripheral portion of the conductive metal sheet extends as a control electrode to an outside of the device is supplied with a control signal so as to control operation of the semiconductor chips.

3. A multichip press-contact type semiconductor device according to claim 1, wherein the conductive metal sheet includes a metal which is most approximate to silicon in thermal expansion coefficient.

4. A multichip press-contact type semiconductor device according to claim 1, wherein the conductive metal sheet includes at least one of hard copper and molybdenum.

5. A multichip press-contact type semiconductor device according to claim 1, further comprising a heat buffer disk plate disposed between the semiconductor chips and the second press-contact electrode plate.

6. A multichip press-contact type semiconductor device according to claim 1, further comprising a chip frame for horizontally positioning and fixing each of the semiconductor chips.

7. A multichip press-contact type semiconductor device according to claim 6, further comprising an insulating frame which is disposed on the main surfaces of the semiconductor chips and has openings at positions corresponding to the semiconductor chips, wherein the insulating frame and the heat buffer disk plate press the semiconductor chips therebetween in upper and lower directions to vertically position and fix the semiconductor chips.

8. A multichip press-contact type semiconductor device according to claim 7, further comprising a ring frame which has an opening corresponding to the second press-contact electrode plate and is engaged with the insulating frame so as to hold therebetween the semiconductor chips and the heat buffer disk plate.

9. A multichip press-contact type semiconductor device according to claim 1, wherein the semiconductor chips includes IGBT chips and FRD chips connected to the IGBT chips in parallel in a current-flowing direction opposite to that of the IGBT chips.

10. A multichip press-contact type semiconductor device comprising:

a plurality of semiconductor chips located on a plane;

a conductive metal sheet, disposed on main surfaces of the semiconductor chips, for decreasing parasitic inductances in an electrode wiring connecting the semiconductor chips;

a plurality of heat buffer plates each provided on the conductive metal sheet to correspond to each of the plurality of semiconductor chips;

a first press-contact electrode plate disposed on the conductive metal sheet, the first press-contact electrode plate having column protrusions corresponding to the semiconductor chips on a side facing the semiconductor chips;

a second press-contact electrode plate disposed on rear surfaces of the semiconductor chips; and an insulating member disposed in non-pressed portions of the semiconductor chips and between the conductive metal sheet and chip frames in order to secure a creepage distance between electrodes in each of the semiconductor chips, wherein the heat buffer plates, the conductive metal sheet, and the semiconductor chips are, stacked and brought into press-contact with each other by the first and second press-contact electrode plates.

11. A multichip press-contact type semiconductor device according to claim 10, wherein a peripheral portion of the conductive metal sheet extends as a control electrode to an outside of the device and is supplied with a control signal so as to control operation of the semiconductor chips.

12. A multichip press-contact type semiconductor device according to claim 10, wherein the conductive metal sheet includes a metal which is most approximate to silicon in thermal expansion coefficient.

13. A multichip press-contact type semiconductor device according to claim 10, wherein the conductive metal sheet includes at least one of hard copper and molybdenum.

14. A multichip press-contact type semiconductor device according to claim 10, further comprising a heat buffer disk plate disposed between the semiconductor chips and the second press-contact electrode plate.

15. A multichip press-contact type semiconductor device according to claim 10, further comprising a chip frame for horizontally positioning and fixing each of the semiconductor chips.

16. A multichip press-contact type semiconductor device according to claim 15, further comprising an insulating frame which is disposed on the main surfaces of the semiconductor chips and has openings at positions corresponding to the semiconductor chips, wherein the insulating frame and the heat buffer disk plate press the semiconductor chips therebetween in upper and lower directions to vertically position and fix the semiconductor chips.

17. A multichip press-contact type semiconductor device according to claim 16, further comprising a ring frame which has an opening corresponding to the second press-contact electrode plate and is engaged with the insulating frame so as to hold therebetween the semiconductor chips and the heat buffer disk plate.

18. A multichip press-contact type semiconductor device according to claim 10, wherein the semiconductor chips includes IGBT chips and FRD chips connected to the IGBT chips in parallel in a current-flowing direction opposite to that of the IGBT chips.

* * * * *